United States Patent
Jayasinghe Laddu et al.

(10) Patent No.: US 11,165,536 B2
(45) Date of Patent: Nov. 2, 2021

(54) EARLY TERMINATION WITH DISTRIBUTED CRC POLAR CODES

(71) Applicant: NOKIA TECHNOLOGIES OY, Espoo (FI)

(72) Inventors: Keeth Saliya Jayasinghe Laddu, Piliyandala (LK); Jie Chen, Schaumburg, IL (US); Dongyang Du, Zhejiang (CN); Yu Chen, Shanghai (CN)

(73) Assignee: NOKIA TECHNOLOGIES OY, Espoo (FI)

( * ) Notice: Subject to any disclaimer, the term of this patent is extended or adjusted under 35 U.S.C. 154(b) by 74 days.

(21) Appl. No.: 16/494,050

(22) PCT Filed: Mar. 15, 2017

(86) PCT No.: PCT/CN2017/076750
§ 371 (c)(1),
(2) Date: Sep. 13, 2019

(87) PCT Pub. No.: WO2018/165894
PCT Pub. Date: Sep. 20, 2018

(65) Prior Publication Data
US 2021/0119733 A1    Apr. 22, 2021

(51) Int. Cl.
*H03M 13/00*     (2006.01)
*H04L 1/00*      (2006.01)

(52) U.S. Cl.
CPC ......... *H04L 1/0061* (2013.01); *H04L 1/0076* (2013.01)

(58) Field of Classification Search
CPC .......................... H04L 1/0061; H04L 1/0076
See application file for complete search history.

(56) References Cited

U.S. PATENT DOCUMENTS

| 2008/0090517 A1* | 4/2008 | Cheng | H04L 1/1825 455/39 |
| 2014/0351672 A1* | 11/2014 | Marrow | H03M 13/3738 714/764 |

(Continued)

FOREIGN PATENT DOCUMENTS

| CN | 106301387 A | 1/2017 |
| WO | WO-2018192514 A1 * | 10/2018 ......... G06F 9/30029 |

OTHER PUBLICATIONS

European Search Report dated Oct. 19, 2020 corresponding to European Patent Application No. 17900463.5.

(Continued)

*Primary Examiner* — Samir W Rizk
(74) *Attorney, Agent, or Firm* — Squire Patton Boggs (US) LLP

(57) ABSTRACT

A method for encoding a sequence of control information bits comprising: generating a sequence of error detection bits based on the sequence of control information bits; generating a sequence of error correction bits based on the sequence of control information bits; and distributing the sequence of error detection bits and the sequence of error correction bits between the sequence of control information bits to form a combined sequence of bits, such that the bit order of the combined sequence of bits following the distribution enables an error detection check to be performed before or after a first error correction check bit.

8 Claims, 6 Drawing Sheets

(56) References Cited

U.S. PATENT DOCUMENTS

2015/0278008 A1    10/2015  Ren et al.
2019/0238270 A1*    8/2019  Pan .................. H04W 74/0833

OTHER PUBLICATIONS

Huawei et al: "Parity-Check polar and CRC-aided polar evaluation," 3GPP Draft; R1-1701701, 3GPP TSG RAN WG1 Meeting #88, Athens, Greece, Feb. 12, 2017, XP051208867.
Nokia et al: "Details of CRC distribution of Polar design," 3GPP Draft; R1-1703497, 3GPP TSG-RAN WG1 Meeting #88, Athens, Greece, Feb. 15, 2017, XP051222045.
Mao-Ching Chiu et al: "Reduced-Complexity SCL Decoding of Multi-CRC-Aided Polar Codes," Sep. 28, 2016, pp. 1-9, XP055384603.
International Search Report and Written Opinion dated Dec. 19, 2017 corresponding to International Patent Application No. PCT/CN2017/076750.
Nokia et al., "Details of CRC distribution of Polar design," 3GPP; R1-1703497, 3GPP TSG-RAN WG1 Meeting #88, Athens, Greece, Feb. 17, 2017.
Huawei et al., "Parity-Check polar and CRC-aided polar evaluation," 3GPP; R1-1701701, 3GPP TSG RAN WG1 Meeting #88, Athens, Greece, Feb. 17, 2017.

* cited by examiner

Figure 5

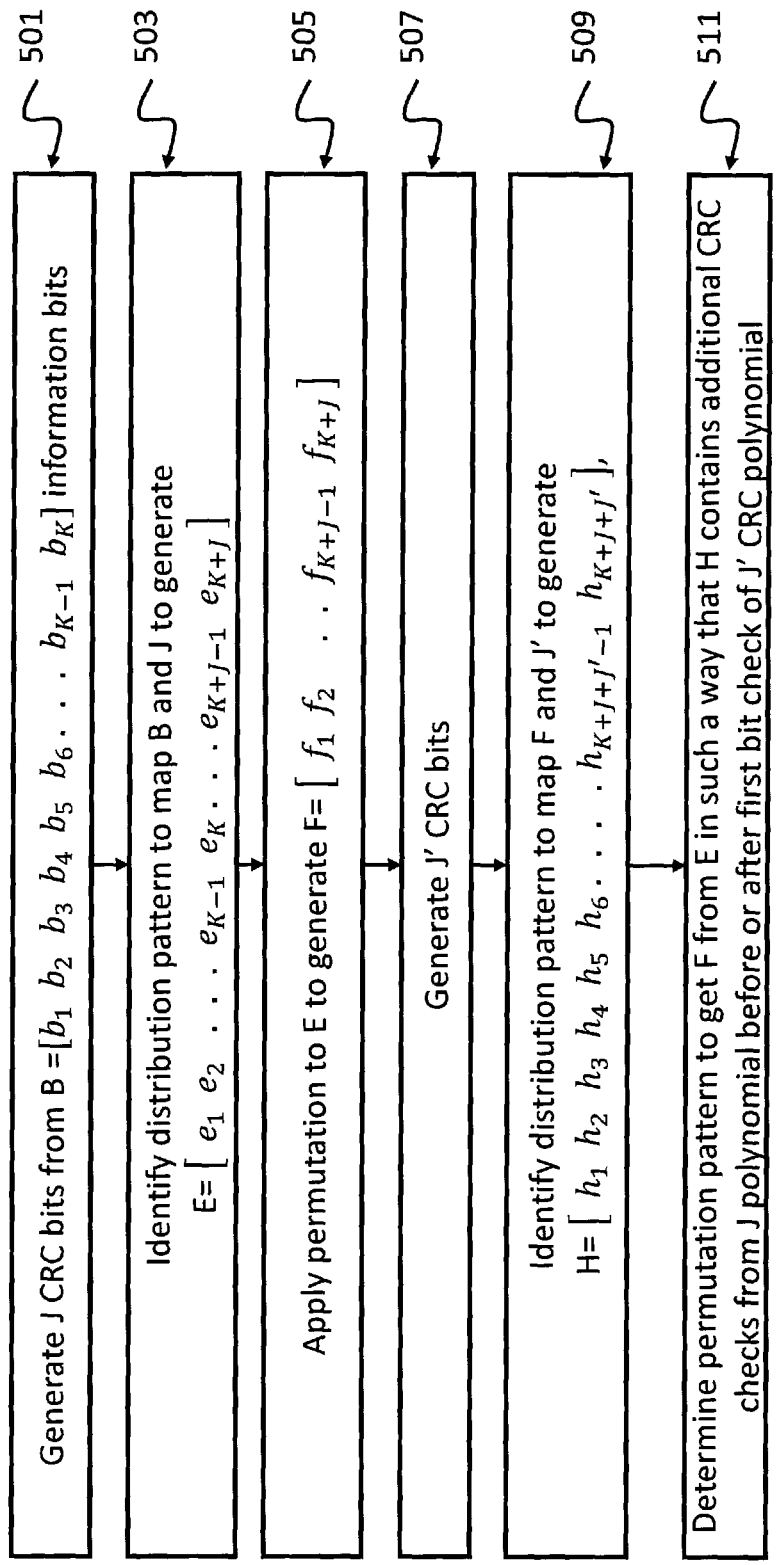

- 501: Generate J CRC bits from B =$[b_1\ b_2\ b_3\ b_4\ b_5\ b_6\ \ldots\ b_{K-1}\ b_K]$ information bits
- 503: Identify distribution pattern to map B and J to generate $E=[\ e_1\ e_2\ \ldots\ e_{K-1}\ e_K\ \ldots\ e_{K+J-1}\ e_{K+J}\ ]$
- 505: Apply permutation to E to generate F=$[\ f_1\ f_2\ \ldots\ f_{K+J-1}\ f_{K+J}\ ]$
- 507: Generate J' CRC bits
- 509: Identify distribution pattern to map F and J' to generate $H=[\ h_1\ h_2\ h_3\ h_4\ h_5\ h_6\ \ldots\ h_{K+J+J'-1}\ h_{K+J+J'}\ ]$,
- 511: Determine permutation pattern to get F from E in such a way that H contains additional CRC checks from J polynomial before or after first bit check of J' CRC polynomial

EARLY TERMINATION WITH DISTRIBUTED CRC POLAR CODES

Polar codes, have been chosen to be used for 5G eMBB (enhanced Mobile Broadband) control channels and maybe also for mMTC (massive Machine Type Communications) because it has advantages compared to the other candidate coding schemes. For example it promises low complexity while achieving close to capacity levels of performance.

A CRC construction mechanism has been proposed with J' bits for the purpose of assisting the polar decoding, where $0<=J'<=Jmax$, aiming for Jmax, e.g. in the region of 8 (other values are not precluded). This mechanism does not preclude the use of the J bits for assisting decoding and any PC-frozen bits are considered to be among the J' bits.

The following are examples:
J bits CRC+J' bits CRC+basic polar;
J bits CRC+J' bits distributed CRC+basic polar;
J bits CRC+J' Parity Check bits+basic polar; (Parity Check-Polar);
J bits CRC+J' Hash sequence+basic polar;
(J+J') bits CRC+basic polar.

In the proposals mentioned above there are J CRC bits for error detection and J' (additional) bits which may be CRC, Parity, or Hash bits used for error correction purposes. The J' error correcting bits can be placed in the non-frozen or frozen bit positions such a way that tree pruning happens whenever an info bit and associated CRC/parity/or Hash bit is available. In R1-1703497 "Details of CRC distribution of Polar design", Nokia, Alcatel-Lucent Shanghai Bell in in 3GPP TSG RAN WG1 Meeting #88, Athens, Greece, February 2017, a distributed method is proposed for tree pruning by distributing info and CRC bits such a way that it allows CRC checks to occur much earlier than usually happens. This allows early termination of the decoding.

In general, early termination is useful as it reduces the energy consumption of blind decodes and reduces the latency of recovery. However, relying on a single CRC or parity bit to terminate the decoding process can lead to higher miss detection, where the receiver discards the transmission when the CRC or parity bit is failed (for the decoded part of info bits).

There is hereby provided a method for encoding a sequence of control information bits comprising: generating a sequence of error detection bits based on the sequence of control information bits; generating a sequence of error correction bits based on the sequence of control information bits; and distributing the sequence of error detection bits and the sequence of error correction bits between the sequence of control information bits to form a combined sequence of bits, such that the bit order of the combined sequence of bits following the distribution enables an error detection check to be performed before or after a first error correction check bit.

The method may further comprise polar encoding the combined sequence of bits.

Distributing the set of error detection bits and the set of error correction bits between the sequence of control information bits may further comprise: determining a first distribution pattern to form a first combined sequence of bits comprising the sequence of error detection bits and the sequence of control information bits; applying the first distribution pattern to the sequence of error detection bits and the sequence of control information bits to generate the first combined sequence of bits.

Generating a sequence of error detection bits based on the sequence of control information bits and applying the first distribution pattern to the sequence of error detection bits and the sequence of control information bits to generate the first combined sequence of bits may comprise applying an error detection generator to the sequence of control information bits, wherein the error detection generator may be further configured to arrange the first combined sequence of bits such that it enables the ability to perform early termination.

The error detection generator may comprise an upper triangular structure of a check part of the generator such that the error detection generator may be configured to arrange the first combined sequence of bits such that it enables an ability to perform early termination.

Generating a sequence of error correction bits based on the sequence of control information bits may comprise generating the error correction bits from the first combined sequence of bits comprising control information bits and error detection bits.

Distributing the sequence of error detection bits and the sequence of error correction bits between the sequence of control information bits may further comprise: determining a second distribution pattern to form the combined sequence of bits comprising the sequence of error detection bits, the sequence of error correction bits and the sequence of control information bits; and applying the second distribution pattern to the first combined sequence of bits and the sequence of error correction bits to generate the combined sequence of bits.

Generating the sequence of error correction bits based on the sequence of control information bits and applying the second distribution pattern to the sequence of error detection bits and the sequence of control information bits to generate the combined sequence of bits may comprise applying an error correction generator to the first combined sequence of bits, wherein the error correction generator may be further configured to arrange the combined sequence of bits such that it enables the ability to perform early termination.

The error correction generator may comprise an upper triangular structure of a check part of the generator such that the error correction generator may be configured to arrange the combined sequence of bits such that it enables an ability to perform early termination.

Generating a sequence of error correction bits based on the sequence of control information bits may comprises one of: generating the sequence of error correction bits based on the sequence of control information bits and the error detection bits; generating the sequence of error correction bits based on the sequence of control information bits only; and generating the sequence of error correction bits based on part of the sequence of control information bits and part of the error detection bits.

According to a second aspect there is provided a method for decoding a combined sequence of bits comprising a sequence of error detection bits, a sequence of error correction bits and a sequence of control information bits such that the bit order of the sequences enables an error detection check to be performed before or after a first error correction check bit, the method comprising: decoding the combined sequence to enable a first error correction check to be performed, the decoding generating a first error correction check bit and associated information bits; performing a first error correction check based on the first error correction check bit and associated information bits; performing an error detection check based on a first error detection check bit when failing the first error correction check; further decoding until the next error correction or error detection check bit is decoded when passing the error detection check;

and performing a further error correction or error detection check based on the next decoded error correction or error detection check bit.

The method may further comprise terminating decoding when failing the error detection check.

The method may further comprise terminating decoding when failing the further error correction or error detection check.

The method may further comprise performing further decoding when passing the first error correction check.

The method may further comprise performing further decoding when passing the further error correction or error detection check.

The error detection bit may be a cyclic redundancy check bit.

The error correction bit may comprise: a cyclic redundancy check bit; a parity check bit; and a hash bit.

According to a third aspect there is also hereby provided an apparatus for encoding a sequence of control information bits, the apparatus comprising: a processor and memory including computer program code, wherein the memory and computer program code are configured to, with the processor, cause the apparatus to: generate a sequence of error detection bits based on the sequence of control information bits; generate a sequence of error correction bits based on the sequence of control information bits; and distribute the sequence of error detection bits and the sequence of error correction bits between the sequence of control information bits to form a combined sequence of bits, such that the bit order of the combined sequence of bits following the distribution enables an error detection check to be performed before or after a first error correction check bit.

The apparatus may further be caused to polar encode the combined sequence of bits.

The apparatus caused to distribute the set of error detection bits and the set of error correction bits between the sequence of control information bits may further be caused to: determine a first distribution pattern to form a first combined sequence of bits comprising the sequence of error detection bits and the sequence of control information bits; apply the first distribution pattern to the sequence of error detection bits and the sequence of control information bits to generate the first combined sequence of bits.

The apparatus caused to generate a sequence of error detection bits based on the sequence of control information bits and apply the first distribution pattern to the sequence of error detection bits and the sequence of control information bits to generate the first combined sequence of bits may be caused to apply an error detection generator to the sequence of control information bits, wherein the error detection generator may be further configured to arrange the first combined sequence of bits such that it enables the ability to perform early termination.

The error detection generator may comprise an upper triangular structure of a check part of the generator such that the error detection generator may be configured to arrange the first combined sequence of bits such that it enables an ability to perform early termination.

The apparatus caused to generate a sequence of error correction bits based on the sequence of control information bits may be caused to generate the error correction bits from the first combined sequence of bits comprising control information bits and error detection bits.

The apparatus caused to distribute the sequence of error detection bits and the sequence of error correction bits between the sequence of control information bits may be caused to: determine a second distribution pattern to form the combined sequence of bits comprising the sequence of error detection bits, the sequence of error correction bits and the sequence of control information bits; and apply the second distribution pattern to the first combined sequence of bits and the sequence of error correction bits to generate the combined sequence of bits.

The apparatus caused to generate the sequence of error correction bits based on the sequence of control information bits and apply the second distribution pattern to the sequence of error detection bits and the sequence of control information bits to generate the combined sequence of bits may be caused to apply an error correction generator to the first combined sequence of bits, wherein the error correction generator may be further configured to arrange the combined sequence of bits such that it enables the ability to perform early termination.

The error correction generator may comprise an upper triangular structure of a check part of the generator such that the error correction generator may be configured to arrange the combined sequence of bits such that it enables an ability to perform early termination.

The apparatus caused to generate a sequence of error correction bits based on the sequence of control information bits may be caused to perform one of: generate the sequence of error correction bits based on the sequence of control information bits and the error detection bits; generate the sequence of error correction bits based on the sequence of control information bits only; and generate the sequence of error correction bits based on part of the sequence of control information bits and part of the error detection bits.

According to a fourth aspect there is also hereby provided an apparatus for decoding a combined sequence of bits comprising a sequence of error detection bits, a sequence of error correction bits and a sequence of control information bits such that the bit order of the sequences enables an error detection check to be performed before or after a first error correction check bit, the apparatus comprising: a processor and memory including computer program code, wherein the memory and computer program code are configured to, with the processor, cause the apparatus to: decode the combined sequence to enable a first error correction check to be performed, the decoding generating a first error correction check bit and associated information bits; perform a first error correction check based on the first error correction check bit and associated information bits; perform an error detection check based on a first error detection check bit when failing the first error correction check; further decode until the next error correction or error detection check bit is decoded when passing the error detection check; and perform a further error correction or error detection check based on the next decoded error correction or error detection check bit.

The apparatus may be further caused to terminate decoding when failing the error detection check.

The apparatus may be further caused to terminate decoding when failing the further error correction or error detection check.

The apparatus may be further caused to perform further decoding when passing the first error correction check.

The apparatus may be further caused to perform further decoding when passing the further error correction or error detection check.

The error detection bit may be a cyclic redundancy check bit.

The error correction bit may comprise: a cyclic redundancy check bit; a parity check bit; and a hash bit.

According to a fifth aspect there is also hereby provided an apparatus for encoding a sequence of control information bits, the apparatus comprising: means for generating a sequence of error detection bits based on the sequence of control information bits; means for generating a sequence of error correction bits based on the sequence of control information bits; and means for distributing the sequence of error detection bits and the sequence of error correction bits between the sequence of control information bits to form a combined sequence of bits, such that the bit order of the combined sequence of bits following the distribution enables an error detection check to be performed before or after a first error correction check bit.

The apparatus may further comprise means for polar encoding the combined sequence of bits.

The means for distributing the set of error detection bits and the set of error correction bits between the sequence of control information bits may further comprise: means for determining a first distribution pattern to form a first combined sequence of bits comprising the sequence of error detection bits and the sequence of control information bits; means for applying the first distribution pattern to the sequence of error detection bits and the sequence of control information bits to generate the first combined sequence of bits.

The means for generating a sequence of error detection bits based on the sequence of control information bits and means for applying the first distribution pattern to the sequence of error detection bits and the sequence of control information bits to generate the first combined sequence of bits may comprise means for applying an error detection generator to the sequence of control information bits, wherein the error detection generator may be further configured to arrange the first combined sequence of bits such that it enables the ability to perform early termination.

The error detection generator may comprise an upper triangular structure of a check part of the generator such that the error detection generator may be configured to arrange the first combined sequence of bits such that it enables an ability to perform early termination.

The means for generating a sequence of error correction bits based on the sequence of control information bits may comprise means for generating the error correction bits from the first combined sequence of bits comprising control information bits and error detection bits.

The means for distributing the sequence of error detection bits and the sequence of error correction bits between the sequence of control information bits may further comprise: means for determining a second distribution pattern to form the combined sequence of bits comprising the sequence of error detection bits, the sequence of error correction bits and the sequence of control information bits; and applying the second distribution pattern to the first combined sequence of bits and the sequence of error correction bits to generate the combined sequence of bits.

The means for generating the sequence of error correction bits based on the sequence of control information bits and means for applying the second distribution pattern to the sequence of error detection bits and the sequence of control information bits to generate the combined sequence of bits may comprise means for applying an error correction generator to the first combined sequence of bits, wherein the error correction generator may be further configured to arrange the combined sequence of bits such that it enables the ability to perform early termination.

The error correction generator may comprise an upper triangular structure of a check part of the generator such that the error correction generator may be configured to arrange the combined sequence of bits such that it enables an ability to perform early termination.

The means for generating a sequence of error correction bits based on the sequence of control information bits may comprise one of: means for generating the sequence of error correction bits based on the sequence of control information bits and the error detection bits; means for generating the sequence of error correction bits based on the sequence of control information bits only; and means for generating the sequence of error correction bits based on part of the sequence of control information bits and part of the error detection bits.

According to a sixth aspect there is provided an apparatus for decoding a combined sequence of bits comprising a sequence of error detection bits, a sequence of error correction bits and a sequence of control information bits such that the bit order of the sequences enables an error detection check to be performed before or after a first error correction check bit, the apparatus comprising: means for decoding the combined sequence to enable a first error correction check to be performed, the decoding generating a first error correction check bit and associated information bits; means for performing a first error correction check based on the first error correction check bit and associated information bits; means for performing an error detection check based on a first error detection check bit when failing the first error correction check; means for further decoding until the next error correction or error detection check bit is decoded when passing the error detection check; and means for performing a further error correction or error detection check based on the next decoded error correction or error detection check bit.

The apparatus may further comprise means for terminating decoding when failing the error detection check.

The apparatus may further comprise means for terminating decoding when failing the further error correction or error detection check.

The apparatus may further comprise means for performing further decoding when passing the first error correction check.

The apparatus may further comprise means for performing further decoding when passing the further error correction or error detection check.

The error detection bit may be a cyclic redundancy check bit.

The error correction bit may comprise: a cyclic redundancy check bit; a parity check bit; and a hash bit.

There is also hereby provided a computer program product comprising program code means which when loaded into a computer controls the computer to perform the method described herein.

Examples of techniques according to embodiments of the invention are described hereunder in detail, by way of example only, with reference to the accompanying drawings, in which:

FIG. 5 is a flow diagram of the operation of the encoder as shown in FIG. 4 according to some embodiments;

Techniques according to embodiments of the present invention are described in detail below, by way of example only.

The concepts as discussed in further detail propose new methods for enabling early termination utilizing CRC bits purposed for both error correction and detection.

The distribution as disclosed herein can also in some embodiments be used with respect to parity or hash bits, where parity or hash bits are distributed such a way that they can decode together with the information bits and be used to enable the early termination.

Figure 1:
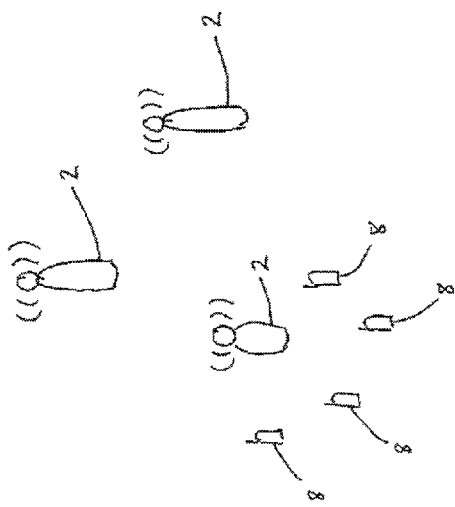
FIG. 1 illustrates one example of an environment in which embodiments of the present invention may be implemented.

FIG. 1 schematically shows an example of four user equipments (UEs) (for example, high complexity devices such as smartphones etc., low complexity devices such as Machine Type Communications (MTC) devices or any other type of wireless communication device) 8 located within the coverage area of a cell operated by a wireless network infrastructure node, which is generally referred to below as a base station (BS). FIG. 1 only shows a small number of base stations, but a radio access network typically comprises a large number of base stations each operating one or more cells.

Each BS 2 of a radio access network is typically connected to one or more core network entities and/or a mobile management entity etc., but these other entities are omitted from FIG. 1 for conciseness.

Figure 2:
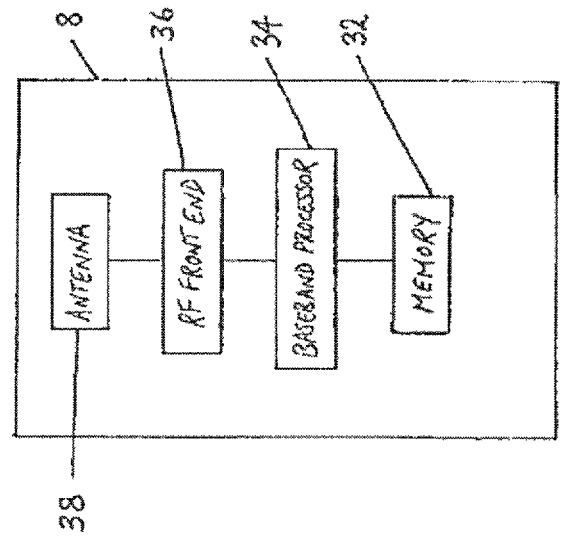
FIG. 2 illustrates one example of apparatus for use at the UEs of Figure1.

FIG. 2 shows a schematic view of an example of apparatus for each UE 8. The UE 8 may be used for various tasks such as making and receiving phone calls, receiving and sending data from and to a data network, and experiencing, for example, multimedia or other content. The UE 8 may be any device at least capable of both recovering data/information from radio transmissions made by the BS 2, and making radio transmissions from which data/information is recoverable by the BS 2. Non-limiting examples of user equipment (UE) 8 include smartphones, tablets, personal computers, and devices without any user interface, such as devices that are designed for machine type communications (MTC).

With reference to FIG. 2, a baseband processor 34, operating in accordance with program code stored at memory 32, controls the generation and transmission of radio signals via radio-frequency (RF) front end 36 and antenna 38. The RF front end 36 may include an analogue transceiver, filters, a duplexer, and antenna switch. Also, the combination of antenna 38, RF front end 36 and baseband processor 34 recovers data/information from radio signals reaching UE 8 from e.g. BS 2. The UE 8 may also comprise an application processor (not shown) that generates user data for transmission via radio signals, and processes user data recovered from radio signals by baseband processor 34 and stored at memory 32.

The application processor and the baseband processor 34 may be implemented as separate chips or combined into a single chip. The memory 32 may be implemented as one or more chips. The memory 32 may include both read-only memory and random-access memory. The above elements may be provided on one or more circuit boards.

The UE may include additional other elements not shown in FIG. 2. For example, the UE 8 may include a user interface such as a key pad, voice command recognition device, touch sensitive screen or pad, combinations thereof or the like, via which a user may control operation of the UE 8. The UE 8 may also include a display, a speaker and a microphone. Furthermore, the UE 8 may comprise appropriate connectors (either wired or wireless) to other devices and/or for connecting external accessories (e.g. hands-free equipment) thereto.

Figure 3:
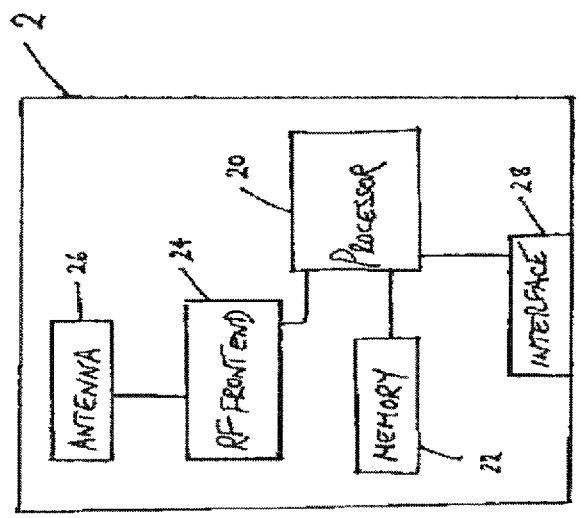
FIG. 3 illustrates one example of apparatus for use at the eNB of FIG. 1.

FIG. 3 shows an example of apparatus for use at the BS 2 of FIG. 1. A baseband processor 20, operating in accordance with program code stored at memory 22, (a) controls the generation and transmission of radio signals via the combination of RF front end 24 and antenna 26; and (b) recovers control information/data from radio transmissions reaching the BS from e.g. UEs 8. The RF front end may include an analogue transceiver, filters, a duplexer, and antenna switch. Both the processor 20 and the memory 22 may be implemented as one or more chips. The memory 22 may include both read-only memory and random-access memory. The above elements may be provided on one or more circuit boards. The apparatus also comprises an interface 28 for transferring data to and from one or more other entities such as e.g. core network entities, mobile management entities, and other base stations in the same access network.

It should be appreciated that the apparatus shown in each of FIGS. 2 and 3 described above may comprise further elements which are not directly involved with the embodiments of the invention described hereafter.

Figure 4:
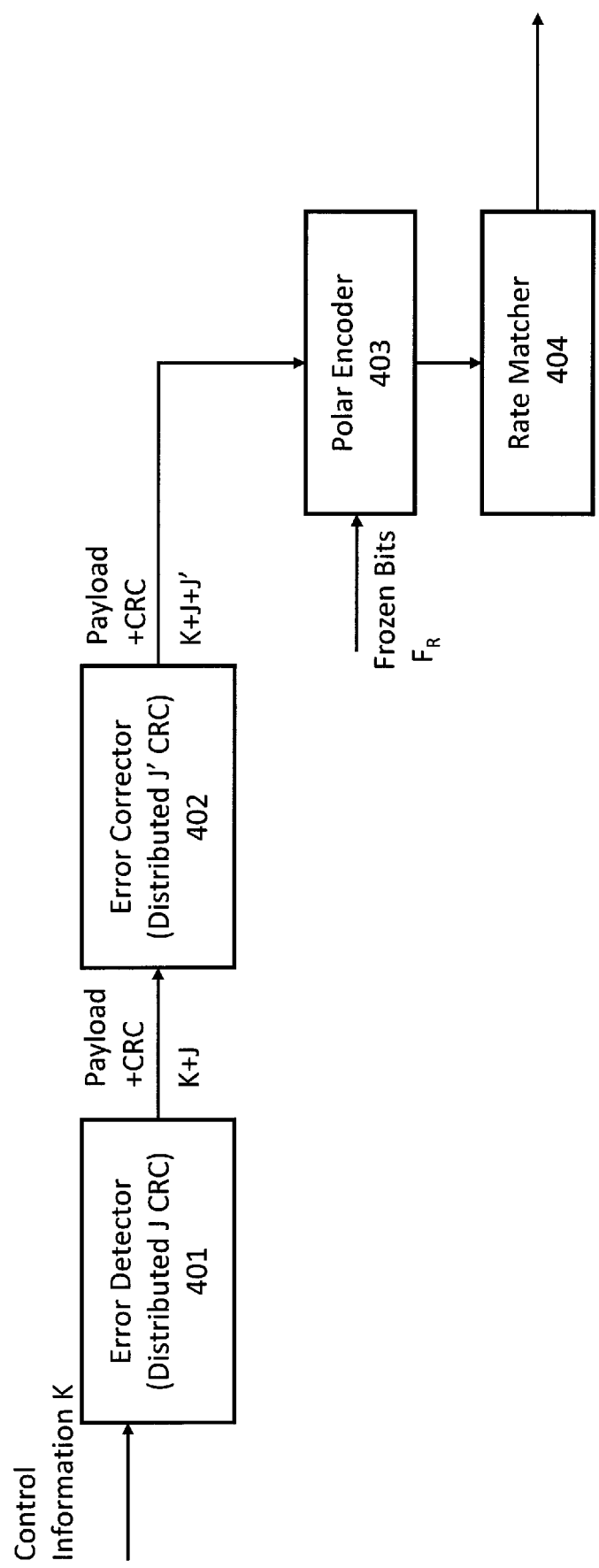
FIG. 4 illustrates an example encoder for use in the UEs and eNB of FIGS. 1 to 3 according to some embodiments.

With respect to FIG. 4 an example of a two stage J and J' CRC attachment apparatus is shown.

The information bits of the control information or control payload, K bits, are passed to an error detector 401 which is configured to encode the control information with CRC J bits which are used for the error detection purpose. The encoded bits, K+J bits, are then passed to an error corrector 402 configured to encode the K+J bits with CRC J' bits for error correction purposes. The encoded bits, K+J+J' bits, are then passed to a polar encoder 403. The polar encoder 403 may be configured to receive the known frozen bits and further configured to map the encoded bits to the most reliable locations of the polar code word prior encoding. The output of the polar encoder 403 is then passed to the rate matcher 404 configured to rate match the output of the polar encoder 403 with a suitable output binary channel.

The CRC distribution performed in the error detector 401 and the error corrector 402 is mainly obtained by observing a generator matrix of the CRC polynomial. A specific CRC bit is related only to a subset of the information bits, and not all of them. In the successive decoding of the polar code in the decoder, if all the related information bits are decoded at some decoding stage, the error check of the CRC bit is possible.

For the typical successive cancellation list (SCL) based decoding, at each decoding stage, there are at most L branches kept. So if all these L branches fail for the CRC check of the available CRC bits, there must be some errors in the codeword, either in the information bits or in the CRC bits. In a normal CRC distribution, it is not possible to correct this and decoding should be terminated.

This is referred to as early termination and may be helpful to reduce the decoding power and reduce the decoding calculations. However, it is possible that information bits are correct and it is the CRC bit that is in error. In such a case the early termination may lead to a missed detection and require the transmitter to transmit the same control message and thus increase the overall latency.

An example of CRC distribution for 11 information bits with 8 CRC bits (with the CRC polynomial [1 1 0 0 1 1 0

1 1]) is shown herein. The corresponding generator matrix G is shown below (where the right 8 bits in each row are the CRC bits associated with the 11 information bits preceding them).

$$G1 = \begin{bmatrix} 1 & 0 & 0 & 0 & 0 & 0 & 0 & 0 & 0 & 0 & 0 & 1 & 0 & 1 & 1 & 0 & 0 & 0 \\ 0 & 1 & 0 & 0 & 0 & 0 & 0 & 0 & 0 & 0 & 0 & 0 & 1 & 0 & 1 & 1 & 0 & 0 \\ 0 & 0 & 1 & 0 & 0 & 0 & 0 & 0 & 0 & 0 & 0 & 0 & 0 & 1 & 0 & 1 & 1 & 0 \\ 0 & 0 & 0 & 1 & 0 & 0 & 0 & 0 & 0 & 0 & 0 & 0 & 0 & 0 & 1 & 0 & 1 & 1 \\ 0 & 0 & 0 & 0 & 1 & 0 & 0 & 0 & 0 & 0 & 1 & 1 & 0 & 0 & 1 & 0 & 0 & 0 \\ 0 & 0 & 0 & 0 & 0 & 1 & 0 & 0 & 0 & 0 & 0 & 1 & 1 & 0 & 0 & 1 & 0 & 0 \\ 0 & 0 & 0 & 0 & 0 & 0 & 1 & 0 & 0 & 0 & 0 & 0 & 1 & 1 & 0 & 0 & 1 & 0 \\ 0 & 0 & 0 & 0 & 0 & 0 & 0 & 1 & 0 & 0 & 0 & 0 & 0 & 1 & 1 & 0 & 0 & 1 \\ 0 & 0 & 0 & 0 & 0 & 0 & 0 & 0 & 1 & 0 & 0 & 1 & 1 & 0 & 0 & 0 & 0 & 1 \\ 0 & 0 & 0 & 0 & 0 & 0 & 0 & 0 & 0 & 1 & 0 & 1 & 0 & 1 & 0 & 1 & 1 & 0 & 1 \\ 0 & 0 & 0 & 0 & 0 & 0 & 0 & 0 & 0 & 1 & 1 & 0 & 0 & 1 & 1 & 0 & 1 & 1 \end{bmatrix}$$

By column and row swapping, the CRC check part of G1 can be converted into the following format where relevant bit indexes are indicated.

$$\begin{bmatrix} 11 & 0 & 0 & 0 & 11 & 11 & 11 & 11 \\ 10 & 0 & 10 & 10 & 0 & 0 & 10 & 10 \\ 9 & 9 & 0 & 0 & 0 & 0 & 0 & 9 \\ 5 & 5 & 0 & 0 & 0 & 0 & 5 & 0 \\ 0 & 1 & 0 & 0 & 0 & 1 & 1 & 0 \\ 0 & 6 & 6 & 6 & 0 & 0 & 0 & 0 \\ 0 & 0 & 7 & 0 & 7 & 7 & 0 & 0 \\ 0 & 0 & 2 & 2 & 0 & 0 & 2 & 0 \\ 0 & 0 & 0 & 3 & 3 & 3 & 0 & 0 \\ 0 & 0 & 0 & 0 & 4 & 0 & 4 & 4 \\ 0 & 0 & 0 & 0 & 0 & 8 & 8 & 8 \end{bmatrix}$$

This matrix shows that the first CRC bit is calculated from information bits with index values of [11 10 9 5], the second with index values of [9 5 1 6] and so on.

Within the decoder the CRC bit will be available for CRC checking when these corresponding information bits are decoded as well as the CRC bit itself. Therefore the distribution of the CRC bits within the information bits can be selected to be in an order wherein the CRC bit follows the defined combination of information bits which are used to generate the CRC bit.

In this case information and CRC bits can be distributed as follows. [11 10 9 5 $CRC_1$ 1 6 $CRC_2$ 7 2 $CRC_3$ 3 $CRC_4$ 4 $CRC_5$ 8 $CRC_6$ $CRC_7$ $CRC_8$]

Where CRCx where x=1 to 8 is the CRC bit index and X is the information bit index.

As shown in FIG. 4 the two CRC polynomials where J' is used for error correction (tree pruning) and J bits CRC is used for error detection can be similarly distributed. Thus even though error detection is required after decoding the full information block, these error detecting CRC bits can be used to improve the reliability of early termination. The following procedure is useful to attain higher reliability and improved error correction of the CRC aided SCL decoding.

With respect to FIG. 5 an example CRC generation and distribution and mapping procedure is described with respect to the apparatus shown in FIG. 4.

The error detector 401 in some embodiments generates the J CRC bits from the information bits B=[$b_1$ $b_2$ $b_3$ $b_4$ $b_5$ $b_6$ ... $b_{K-1}$ $b_K$] using the J bits polynomial as shown in FIG. 5 by step 501.

The error detector 401 may furthermore identify a distribution pattern to map B and J to an output E=[$e_1$ $e_2$ ... $e_{K-1}$ $e_K$ ... $e_{K+J-1}$ $e_{K+J}$], where Row/swapping is used with J CRC generator matrix to make sure that has an upper triangular structure in the check part as shown in FIG. 5 by step 503. The purpose of row/swapping is to rank the bit indexes and to arrange CRC bits in such a way that it enables the ability to perform early termination. The CRC generation can be implemented in some embodiments with or without the upper triangular structure. The row/swapping thus does not change the values of the CRC bits, but reorders the CRC bits (this is the most possible case in practices as we normally use traditional CRC generation methods).

The error detector 401 may furthermore apply a permutation to the K information and J CRC bits to generate F=[$f_1$ $f_2$ ... $f_{K+J-1}$ $f_{K+J}$] as shown in FIG. 5 by step 505.

The error corrector 402 may then apply the J' bits CRC polynomial to all of the bits to generate the J' error correction CRC bits as shown in FIG. 5 by step 507. In some embodiments the polynomial is applied to the information bits only. In some embodiments the polynomial is applied to part of the full block comprising both information and CRC bits.

The error corrector 402 may furthermore be configured to identify a distribution pattern to map F and J' to an output H=[$h_1$ $h_2$ $h_3$ $h_4$ $h_5$ $h_6$ ... $h_{K+J+J'-1}$ $h_{K+J+J'}$], where Row/swapping is used with the J' CRC generator matrix to make sure that has an upper triangular structure in the check part as shown in FIG. 5 by step 509.

The error corrector 402 may be further configured to determine a permutation pattern to get F=[$f_1$ $f_2$ $f_3$ ... $f_{K+J-1}$ $f_{K+J}$] from the distributed bits of E=[$e_1$ $e_2$ $e_3$ ... $e_{K+J-1}$ $e_{K+J}$] in such a way that H=[$h_1$ $h_2$ $h_3$ $h_4$ $h_5$ $h_6$ ... $h_{K+J+J'-1}$ $h_{K+J+J'}$] contains additional CRC checks from the J CRC polynomial before or after the first CRC bit check of the J' CRC polynomial as shown in FIG. 5 by step 511.

Figure 6:
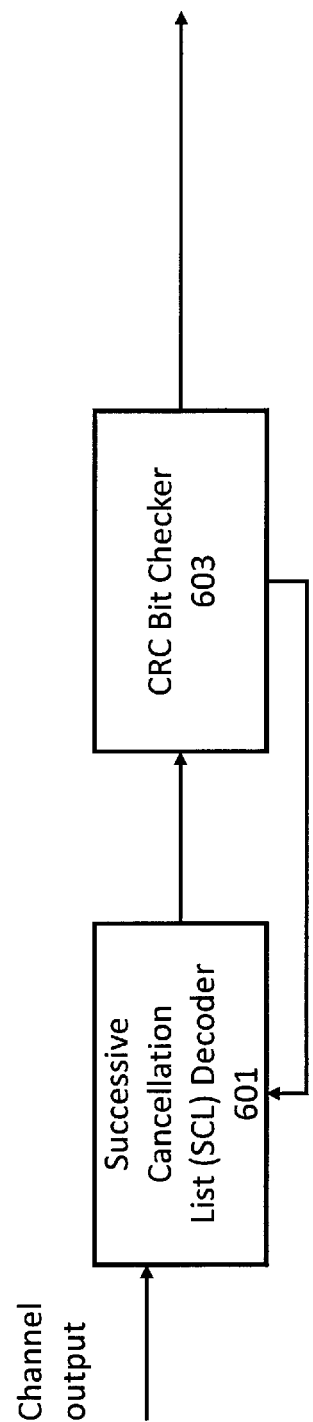
FIG. 6 illustrates an example decoder for use in the UEs and eNB of FIGS. 1 to 3 according to some embodiments.

With respect to FIG. 6 an example decoder is shown. The decoder comprises a successive cancellation list (SCL) decoder 601 which is configured to output bits based on decoding the channel output by applying an inverse to the polar encoding. However in some embodiments the decoder may be any suitable polar decoder variant which uses CRC or parity bits for tree pruning.

The decoder further comprises a CRC bit checker 603 which is configured to apply the CRC check to determine errors in the decoded data and control the successive cancellation decoder 601 based on the checks.

Figure 7:
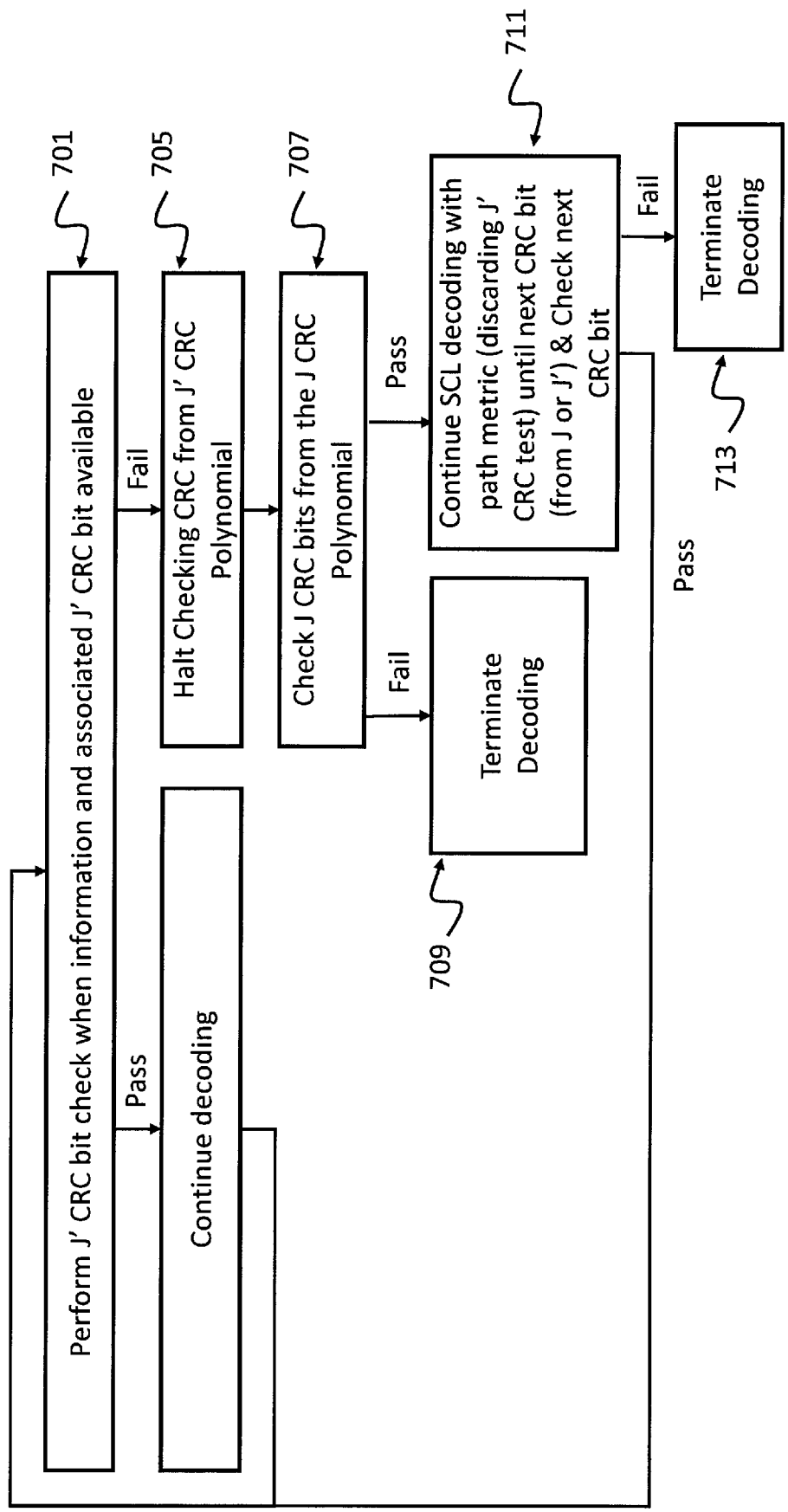
FIG. 7 is a flow diagram of the operation of the encoder as shown in FIG. 6 according to some embodiments.

FIG. 7 shows an example flow diagram showing the operation of the decoder as shown in FIG. 6.

The J' CRC bits may be used for tree pruning, and may be performed whenever information bits and associated CRC bits are available.

The decoder and the successive cancellation decoder may be configured to continue the decoding process. The decoded bits may be passed to the CRC bit checker 603 wherein as soon as J' CRC bits and the information bits are available a first J' CRC bit check is performed (the decoder in other words uses the J CRC bits at the end to detect errors of the decoded information block) as shown in FIG. 7 by step 701.

If the first CRC check is passed then the decoding continues as shown in FIG. 7 by step 703.

If the first CRC is failed, the decoder halts checking CRC from the J' CRC polynomial as shown in FIG. 7 by step 705.

The decoder furthermore is then configured to check CRC bits from the J CRC polynomial. In most cases, some of these CRC bits are decoded prior to the first J' CRC bit. Those CRC bits will be checked to see CRC pass/fail as shown in FIG. 7 by step 707. If the CRC check fails in the J CRC polynomial the decoding can be terminated as shown in FIG. 7 by step 709.

If CRC check passes in the J CRC polynomial, successive cancellation (SCL) decoding is continued with path metric (but discarding J' CRC tests) until the next CRC bit (from J or J') is decoded and then a further check is performed on the this bit as shown in FIG. 7 by step 711.

If the 'further' CRC check is failed, then decoding can be terminated such as shown in FIG. 7 by step 713.

If the 'further' CRC is passed, the decoder can continue with normal decoding process (and the J' CRC bit check performed again when available such as shown by the flow diagram loop back to step 701). Thus when the early termination is scheduled happens with the second or later CRC checks, the same procedure can be used.

Although the examples above show a CRC check procedure, it can also be used with parity check polar codes, where CRC is used for error detection purposes. These CRC bits will thus provide additional reliability for error correction even though the main purpose of CRC used there is for error detection.

A detailed example with 16 information bits, 16 CRC bits with a CRC polynomial [1 0 0 0 1 0 0 0 0 0 0 1 0 0 0 0 1] for error detection, and 4 CRC bits with a polynomial [1 0 1 0 1] for error correction is considered below.

The corresponding generator matrices (only check part) for the 16 bit and 4 bit CRC are denoted as G1 and G2. To identify the distribution, only the row/column swapped version only check part) is presented below.

$$G1 = \begin{vmatrix} 13 & 0 & 0 & 0 & 0 & 13 & 13 & 0 & 0 & 0 & 0 & 0 & 0 & 0 & 0 & 0 \\ 9 & 0 & 0 & 0 & 0 & 9 & 9 & 0 & 0 & 0 & 0 & 9 & 0 & 9 & 0 & 0 \\ 6 & 6 & 0 & 0 & 6 & 0 & 0 & 6 & 6 & 0 & 0 & 6 & 6 & 0 & 0 & 0 \\ 5 & 0 & 0 & 0 & 5 & 5 & 5 & 0 & 0 & 0 & 0 & 5 & 0 & 0 & 5 & 5 \\ 0 & 14 & 0 & 0 & 0 & 0 & 0 & 14 & 0 & 0 & 14 & 0 & 0 & 0 & 0 & 0 \\ 0 & 10 & 0 & 0 & 10 & 0 & 0 & 0 & 10 & 0 & 0 & 10 & 10 & 0 & 0 & 0 \\ 0 & 7 & 7 & 0 & 0 & 0 & 0 & 7 & 0 & 7 & 7 & 0 & 7 & 0 & 0 & 7 \\ 0 & 0 & 8 & 8 & 0 & 0 & 8 & 0 & 0 & 0 & 8 & 0 & 0 & 8 & 8 & 8 \\ 0 & 0 & 15 & 0 & 0 & 0 & 0 & 0 & 15 & 0 & 0 & 15 & 0 & 0 & 0 & 0 \\ 0 & 0 & 11 & 0 & 0 & 0 & 0 & 11 & 0 & 11 & 0 & 0 & 11 & 0 & 0 & 11 \\ 0 & 0 & 0 & 4 & 0 & 0 & 4 & 0 & 0 & 4 & 4 & 0 & 4 & 0 & 4 & 4 \\ 0 & 0 & 0 & 12 & 0 & 0 & 0 & 0 & 0 & 0 & 12 & 0 & 0 & 12 & 12 & 12 \\ 0 & 0 & 0 & 1 & 1 & 1 & 1 & 0 & 0 & 0 & 1 & 1 & 0 & 1 & 0 & 0 \\ 0 & 0 & 0 & 0 & 2 & 2 & 2 & 2 & 2 & 0 & 0 & 2 & 2 & 0 & 0 & 0 \\ 0 & 0 & 0 & 0 & 0 & 0 & 0 & 3 & 3 & 3 & 3 & 3 & 3 & 0 & 0 & 3 \\ 0 & 0 & 0 & 0 & 0 & 0 & 0 & 0 & 0 & 0 & 0 & 0 & 0 & 16 & 16 & 16 \end{vmatrix}$$

$$G2 = \begin{vmatrix} 1 & 0 & 1 & 0 \\ 31 & 0 & 31 & 0 \\ 3 & 0 & 0 & 0 \\ 27 & 0 & 0 & 0 \\ 25 & 0 & 25 & 0 \\ 21 & 0 & 0 & 0 \\ 7 & 0 & 7 & 0 \\ 19 & 0 & 19 & 0 \\ 9 & 0 & 0 & 0 \\ 15 & 0 & 0 & 0 \\ 13 & 0 & 13 & 0 \\ 0 & 32 & 0 & 32 \\ 0 & 2 & 0 & 2 \\ 0 & 14 & 0 & 14 \\ 0 & 10 & 0 & 0 \\ 0 & 16 & 0 & 0 \\ 0 & 28 & 0 & 0 \\ 0 & 4 & 0 & 0 \\ 0 & 8 & 0 & 8 \\ 0 & 20 & 0 & 20 \\ 0 & 26 & 0 & 26 \\ 0 & 22 & 0 & 0 \\ 0 & 0 & 23 & 0 \\ 0 & 0 & 11 & 0 \\ 0 & 0 & 5 & 0 \\ 0 & 0 & 29 & 0 \\ 0 & 0 & 17 & 0 \\ 0 & 0 & 0 & 18 \\ 0 & 0 & 0 & 6 \\ 0 & 0 & 0 & 30 \\ 0 & 0 & 0 & 24 \\ 0 & 0 & 0 & 12 \end{vmatrix}$$

According to G2, $[f_1\ f_2\ f_3\ \ldots\ f_{K+J-1}\ f_{K+J}]$ is distributed to get $[h_1\ h_2\ h_3\ \ldots\ h_{K+J+J'-1}\ h_{K+J+J'}]$. The bit arrangement prior to polar encoding can be the following. Numbers represent bit indexes of $[f_1\ f_2\ f_3\ \ldots\ f_{K+J-1}\ f_{K+J}]$,

[1 31 3 27 25 21 7 19 9 15 13 C1 32 2 14 10 16 28 4 8 20 26 22 C2 23 11 5 29 17 C3 18 6 30 24 12 C4], where Ci (i=1, 2, 3, 4) are CRC bits used for error correction. According to G1, bit indexes from $[b_1\ b_2\ b_3\ b_4\ b_5\ b_6\ \ldots\ b_{K-1}\ b_K]$ are distributed to get $[e_1\ e_2\ \ldots\ e_{K+J-1}\ e_{K+J}]$ as

[13 9 6 5 D1 14 10 7 D2 8 15 11 D3 4 12 1 D4 2 D5 D6 D7 3 D8 D9 D10 D11 D12 D13 16 D14 D15 D16], where Di (i=1, 2, . . . , 16) are CRC bits used for error detection.

Within the mapping stage, $[e_1\ e_2\ \ldots\ e_{K+J-1}\ e_{K+J}]$ to $[f_1\ f_2\ f_3\ \ldots\ f_{K+J-1}\ f_{K+J}]$ is used to facilitate early termination with the help of both J' and J CRC polynomials, therefore, an example mapping can be the following,

[13 D3 6 2 D10 16 10 D5 D2 12 D9 D16 15 4 8 1 D12 D13 7 D6 14 3 D8 D15 D1 D7 5 D4 D11 D14 9 11],

Finally, the information and CRC bits will appear as follows (note that the bit indexes are referring to the actual bit indexes from $[b_1\ b_2\ b_3\ b_4\ b_5\ b_6\ \ldots\ b_{K-1}\ b_K]$.)

[13 9 6 5 D1 14 10 7 D2 8 15 C1 11 D3 4 12 1 D4 2 D5 D6 D7 3 C2 D8 D9 D10 D11 D12 C3 D13 16 D14 D15 D16 C4],

It is evident that when the decoder is using the C1 bit for pruning the paths, D1, D2 bits are already decoded together with their relevant info bits. Thus in the case where C1 fails, D1 and D2 and then D3 will help to identify whether the decoded bits are in error or not. This will facilitate the early termination with lower miss detection probabilities.

Appropriately adapted computer program code product may be used for implementing the embodiments, when loaded to a computer. The program code product for providing the operation may be stored on and provided by means of a carrier medium such as a carrier disc, card or tape. A possibility is to download the program code product via a data network. Implementation may be provided with appropriate software in a server.

Embodiments of the invention may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre stored design modules. Once the design for a semiconductor circuit has been completed, the resultant design, in a standardized electronic format (e.g., Opus, GDSII, or the like) may be transmitted to a semiconductor fabrication facility or "fab" for fabrication.

In addition to the modifications explicitly mentioned above, it will be evident to a person skilled in the art that various other modifications of the described embodiment may be made within the scope of the invention.

What is claimed is:

1. A method for decoding a combined sequence of bits comprising a sequence of error detection bits, a sequence of error correction bits and a sequence of control information bits such that the bit order of the sequences enables an error detection check to be performed before or after a first error correction check bit, the method comprising:
   decoding the combined sequence to enable a first error correction check to be performed, the decoding generating a first error correction check bit and associated information bits;
   performing a first error correction check based on the first error correction check bit and associated information bits;
   performing an error detection check based on a first error detection check bit when failing the first error correction check;
   further decoding until the next error correction or error detection check bit is decoded when passing the error detection check; and
   performing a further error correction or error detection check based on the next decoded error correction or error detection check bit.

2. The method as claimed in claim 1, further comprising terminating decoding when failing the error detection check.

3. The method as claimed in claim 1, further comprising terminating decoding when failing the further error correction or error detection check.

4. The method as claimed in claim 1, further comprising performing further decoding when passing the first error correction check.

5. The method as claimed in claim 1, further comprising performing further decoding when passing the further error correction or error detection check.

6. The method as claimed in claim 1, wherein the error detection bit is a cyclic redundancy check bit.

7. The method as claimed in claim 1, wherein the error correction bit comprises:
   a cyclic redundancy check bit;
   a parity check bit; and
   a hash bit.

8. An apparatus for decoding a combined sequence of bits comprising a sequence of error detection bits, a sequence of error correction bits and a sequence of control information bits such that the bit order of the sequences enables an error detection check to be performed before or after a first error correction check bit, the apparatus comprising: a processor and memory including computer program code, wherein the memory and computer program code are configured to, with the processor, cause the apparatus to:
   decode the combined sequence to enable a first error correction check to be performed, the decoding generating a first error correction check bit and associated information bits;
   perform a first error correction check based on the first error correction check bit and associated information bits;
   perform an error detection check based on a first error detection check bit when failing the first error correction check;
   further decode until the next error correction or error detection check bit is decoded when passing the error detection check; and
   perform a further error correction or error detection check based on the next decoded error correction or error detection check bit.

* * * * *